(12) United States Patent
Kawase

(10) Patent No.: US 6,769,908 B2
(45) Date of Patent: Aug. 3, 2004

(54) WAFER HEAT-TREATMENT SYSTEM AND WAFER HEAT-TREATMENT METHOD

(75) Inventor: Yoshimasa Kawase, Kanagawa (JP)

(73) Assignee: Semiconductor Leading Edge Technologies, Inc., Ibaraki (JP)

( * ) Notice: Subject to any disclaimer, the term of this patent is extended or adjusted under 35 U.S.C. 154(b) by 0 days.

(21) Appl. No.: 10/066,783

(22) Filed: Feb. 6, 2002

(65) Prior Publication Data

US 2002/0148135 A1 Oct. 17, 2002

(30) Foreign Application Priority Data

Feb. 13, 2001 (JP) ............................. 2001-036040

(51) Int. Cl.$^7$ .............................. F27D 15/02

(52) U.S. Cl. .................. 432/77; 432/251; 432/81; 432/4; 118/724

(58) Field of Search ................ 432/4, 77, 81, 432/205, 251, 253; 118/724; 219/399, 405, 390; 392/416, 418

(56) References Cited

U.S. PATENT DOCUMENTS

| | | | | |
|---|---|---|---|---|
| 4,747,368 A | * | 5/1988 | Brien et al. | 118/715 |
| 5,194,401 A | * | 3/1993 | Adams et al. | 438/765 |
| 5,407,349 A | * | 4/1995 | Hansotte et al. | 432/241 |
| 5,453,125 A | * | 9/1995 | Krogh | 118/723 MR |
| 6,259,062 B1 | * | 7/2001 | Pan | 219/390 |
| 6,403,926 B2 | * | 6/2002 | Li | 219/390 |
| 6,472,641 B2 | * | 10/2002 | Suzuki | 219/411 |

* cited by examiner

*Primary Examiner*—Gregory Wilson
(74) *Attorney, Agent, or Firm*—Foley & Lardner LLP

(57) ABSTRACT

A wafer heat-treatment system for processing a wafer by a high-temperature heat-treatment process and cooling the heat-treated wafer, comprises walls surrounding a closed space placing the wafer and having a hollow sealing a gas therein, and a pressure-regulating unit connecting to the hollow for regulating pressure in the hollow. Hence, the wafer heat-treatment system reduces power consumption by heating lamps by carrying out an evacuating process before the high-temperature heat-treatment process, and shortens the time necessary for the cool down process by a pressurizing process that is carried out after the completion of the high-temperature heat-treatment process.

16 Claims, 3 Drawing Sheets

WAFER HEAT-TREATMENT SYSTEM AND WAFER HEAT-TREATMENT METHOD

BACKGROUND OF THE INVENTION

1. Field of the Invention

The present invention relates to a wafer heat-treatment system and a wafer heat-treatment method and, more particularly, to a lamp-heating single-wafer processing heat-treatment system and a lamp-heating single-wafer processing heat-treatment method that processes a single wafer by a film forming process to form an oxide and oxynitride film on a wafer or by an annealing process.

2. Background Art

Referring to FIG. 3 showing a conventional single-wafer heat-treatment system, i.e., a wafer heat-treatment system, there are shown a wafer 1, a processing chamber 2 in which a wafer 1 is processed by a high-temperature heat-treatment process, a gas inlet 2a through which a gas is supplied into the processing chamber 2, a gas outlet 2b through which a gas is exhausted from the processing chamber 2, walls 2c for separating the inner atmosphere of the processing chamber 2 from outside, heating lamps 5, and reflecting plates 4 for reflecting light emitted by the heating lamps 5.

The wafer heat-treatment system shown in FIG. 3 processes the wafer 1 by a high-temperature heat-treatment process having the following steps. A carrying robot, not shown, carries the wafer 1 through a gate, not shown, formed the wall 2c into the processing chamber 2. A shutter, not shown, is closed to close the gate so that the processing chamber 2 is sealed. Then, an inert gas, such as nitrogen, or an oxidizing gas, such as oxygen gas, is supplied through the gas inlet 2a into the processing chamber 2 and, at the same time, initial gas in the chamber is exhausted from the processing chamber 2 through the gas outlet 2b to replace initial gas with the inert gas.

Subsequently, the heating lamps 5 are turned on. Part of light emitted by the heating lamps 5 travel directly through the walls 2c of quartz or the like and part of light emitted by the heating lamps 5 is reflected by the reflecting plates 4 and the reflected light travels through the walls 2c. The wafer 1 is heated for a predetermined time by the energy of the light transmitted through the walls 2c to diffuse an impurity in the wafer 1 or to form a film on the surface of the wafer 1.

After the wafer 1 has been processed by the high-temperature heat-treatment process for the predetermined time, power supply to the heating lamp 5 is stopped and the wafer 1 is begun to cooled. Heat of the wafer 1 is dissipated to outside of the processing chamber 2 through the atmosphere in the processing chamber 2 and the temperature of the wafer 1 decreases. Upon the drop of the temperature of the wafer 1 to several hundreds degrees centigrade, the carrying robot carries the wafer 1 out of the processing chamber 2 through the gate.

Requisite conditions on the depth of junctions have progressively become severe with the miniaturization of semiconductor devices. To meet the requisite conditions on the depth of junctions, an impurity must be doped to a shallow region by using low energy and the diffusion of the impurity must be controlled by limiting thermal budget to the least extent when activating the impurity. Therefore, the reduction of time necessary for the wafer heat-treatment system to carry out the high-temperature heat-treatment process and the cool down process is a very important problem relating to the quality of the device.

In view of the recent high demand for semiconductor devices, the reduction of time necessary for the wafer heat-treatment system to carry out the high-temperature heat-treatment process, including heat up process and soak process, and the cool down process is a very important problem affecting improvement in device performance.

Nevertheless, the foregoing conventional wafer heat-treatment system is subject to various restrictions in shortening time necessary for carrying out the high-temperature heat-treatment process and the cool down process.

Theoretically, time necessary for completing the high-rate heating up process can be reduced by supplying higher power to the heating lamps or increasing the number of the heating lamps to increase the quantity of energy supplied into the processing chamber per unit time. However, an increase in the power supplied to the heating lamps increases running costs and reduces productivity. Thus, the increase in power consumption is improper. Time necessary for completing the soak process can be reduced by shortening a setting time for heat treatment recipe.

Time necessary for completing the cool down process can be reduced by positively dissipating heat from the processing chamber heated at a high temperature. However, heat cannot be efficiently dissipated because the atmosphere surrounding the wafer, the walls of the processing chamber and a lamp housing holding the heating lamps are heated.

SUMMARY OF THE INVENTION

The present invention has been made to solve the foregoing problems and it is therefore an object of the present invention to provide a wafer heat-treatment system and a wafer heat-treatment method using comparatively simple equipment and capable of processing a wafer by a desired heat-treatment process in a short time.

According to one aspect of the present invention, a wafer heat-treatment system for processing a wafer by a high-temperature heat-treatment process and cooling the heat-treated wafer, comprises walls surrounding a closed space placing the wafer and having a hollow sealing a gas therein, and a pressure-regulating unit connecting to the hollow for regulating pressure in the hollow.

According to another aspect of the present invention, in a wafer heat-treatment method, a wafer, which is in a closed space surrounded by walls each having a hollow, is processed by a high-temperature heat-treatment process. The heat-treated wafer which is in the closed space is cooled after the high-temperature heat-treatment process. Pressure in the hollows of the walls is regulated.

Other and further objects, features and advantages of the invention will appear more fully from the following description.

DETAILED DESCRIPTION OF THE PREFERRED EMBODIMENT

Embodiment

Figure 1:
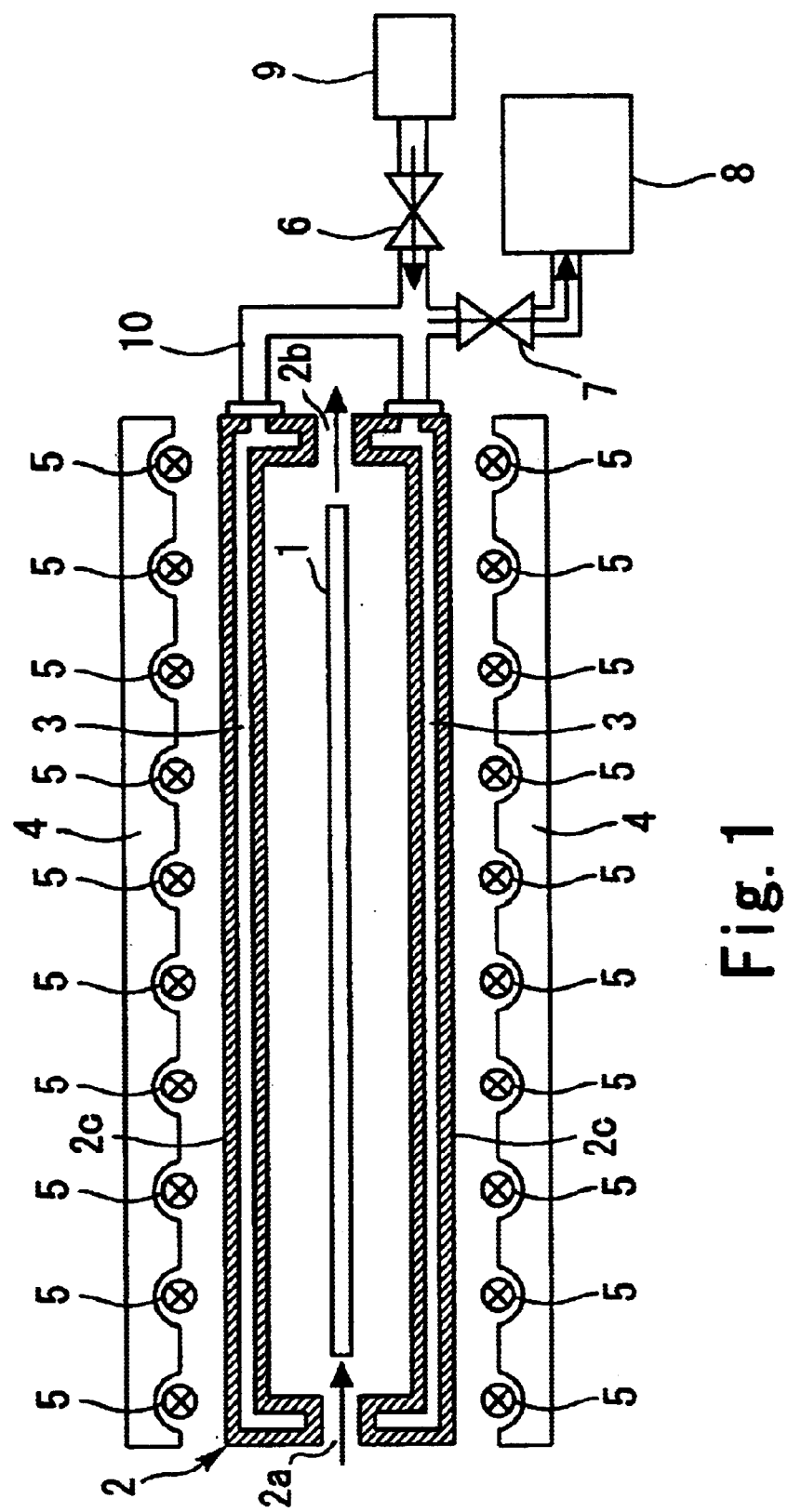
FIG. 1 is a sectional view of a wafer heat-treatment system in an embodiment according to the present invention.

A preferred embodiment of the present invention will be described hereinafter with reference to the accompanying drawings. Referring to FIG. 1 showing a wafer heat-treatment system in a preferred embodiment according to the present invention in a schematic sectional view, there are shown a wafer 1, a processing chamber 2 having a closed space defined by walls 2c, a gas inlet 2a, a gas outlet 2b, hollows 3 in the walls 2c, reflecting plates 4, heating lamps 5, valves 6 and 7, a vacuum pump 8 serving as a component of a pressure regulating unit, a gas supply unit 9 serving as a component of the pressure regulating unit, and pipes 10.

The hollows 3 are capable of sealing a gas therein. The vacuum pump 8 is connected to the hollows 3 of the walls 2c by the pipes 10. The valve 7 is opened and the hollows 3 can be evacuated to a reduced pressure.

The gas supply unit 9 is connected to the hollows 3 by the pipes 10. The pressure in the hollows 3 can be increased by opening the valve 6 momentarily to supply a gas from the gas supply unit 9 into the hollows 3.

The wafer heat-treatment system thus constructed carries out the following steps to process the wafer 1 for high-temperature heat treatment. A carrying robot, not shown, carries the wafer 1 through a gate, not shown, formed in a part of the wall 2c into the processing chamber 2. A shutter, not shown, is closed to close the gate so that the processing chamber 2 is sealed. Then, an inert-gas replacement process is executed to replace initial gas with an inert gas, such as nitrogen gas; the inert gas is supplied through the gas inlet 2a into the processing chamber 2 and, at the same time, initial gas is exhausted from the processing chamber 2 through the gas outlet 2b.

The valve 7 is opened substantially simultaneously with the start of the inert-gas replacement process to carry out an evacuating process to evacuate the hollows 3 of the walls 2c by the vacuum pump 8. Preferably, the hollows 3 are evacuated nearly to a perfect vacuum. The evacuating process for evacuating the hollows 3 is performed for a time substantially equal to a time necessary for the inert-gas replacement process to replace the initial gas in the processing chamber 2 with the inert gas to avoid reducing temperature in the hollows 3. The temperature of a gas filling a closed space decreases if the pressure of the gas filling the closed space is reduced sharply. If the temperature of the gas in the hollows 3 decreases, heat in the processing chamber 2 is transferred to the walls 2c and the temperature of the processing chamber 2 decreases. Therefore, the hollows 3 are evacuated gradually so that the reduction of the pressure in the hollows 3 may not affect adversely to the high-temperature treatment of the wafer 1.

Subsequently, the heating lamps 5 are turned on. Part of light emitted by the heating lamps 5 travel directly through the walls 2c and part of light emitted by the heating lamps 5 is reflected by the reflecting plates 4 and the reflected light travels through the walls 2c. The wafer 1 is heated by the energy of the light transmitted through the walls 2c.

Since the hollows 3 are maintained at a reduced pressure by the vacuum pump 8, the walls 2c have a low thermal conductivity and are heat-insulating. Since the processing chamber 2 is defined by the highly heat-insulating walls 2c, the wafer 1 can be maintained at a high temperature even though the power consumption of the heating lamps 5 is low.

Since the heating lamps 5 give radiant heat to the processing chamber 2, the amount of heat received in the processing chamber 2 is affected scarcely by the variation of the pressure in the hollows 3.

After the high-temperature heat-treatment process for the duration of a set time has been completed, power supply to the heating lamps 5 is stopped, the valve 6 is opened momentarily to supply the gas from the gas supply unit 9 into the hollows 3. The gas supplied into the hollow 3 expands sharply for adiabatic expansion, decreasing its temperature. Consequently, heat radiated by the high-temperature lamp housings and the wafer 1 is absorbed by the low-temperature hollows 3, so that the temperature in the processing chamber 2 drops in a short time.

Preferably, the gas supplied into the hollows 3 by the gas supply unit 9 is the same inert gas as that used for the inert-gas replacement process, such as a nitrogen gas or an oxygen gas, in view of avoiding adverse effect of the gas on the wafer 1 in case the gas supplied to the hollows 3 leaks into the processing chamber 2. The helium gas having high heat conductivity is effective in cooling the wafer 1 in addition to being effective in providing the foregoing effect.

After the temperature of the wafer 1 has decreased to a predetermined level, the carrying robot carries the wafer 1 out of the processing chamber 2 through the gate.

The variations of the pressure in the hollows 3, the temperature of the wafer 1, and power consumption of the heating lamps 5 during the execution of the high-temperature heat-treatment process by the wafer heat-treatment system in the foregoing embodiment will be described hereinafter with reference to the accompanying drawings.

Figure 2:
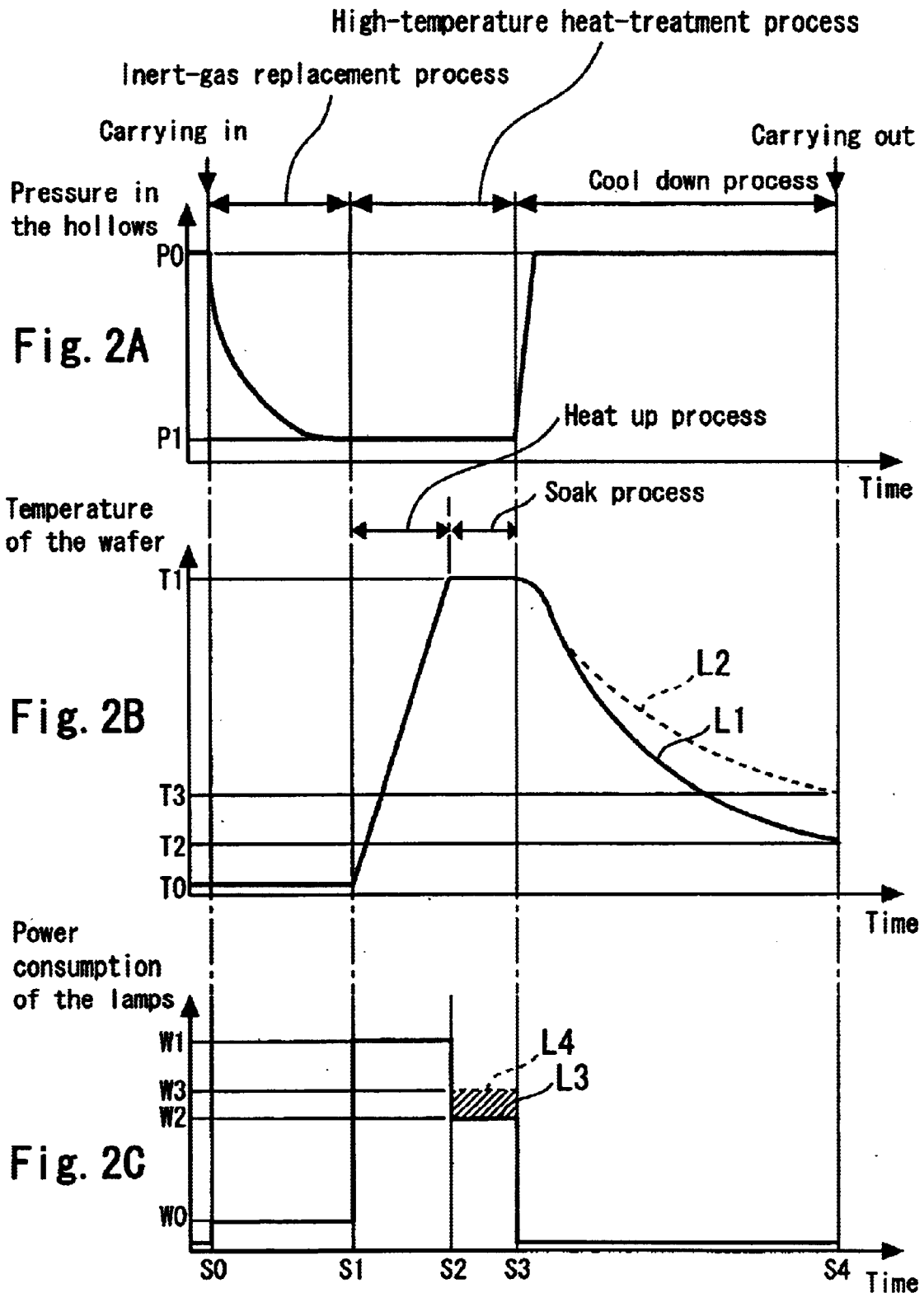
FIG. 2A is a diagram showing the variation of the pressure in the hollows with time in an embodiment according to the present invention.
FIG. 2B is a diagram showing the variation of the temperature of the wafer with time in an embodiment according to the present invention.
FIG. 2C is a diagram showing the variation of the power consumption of the heating lamps with time in an embodiment according to the present invention.
Figure 3:
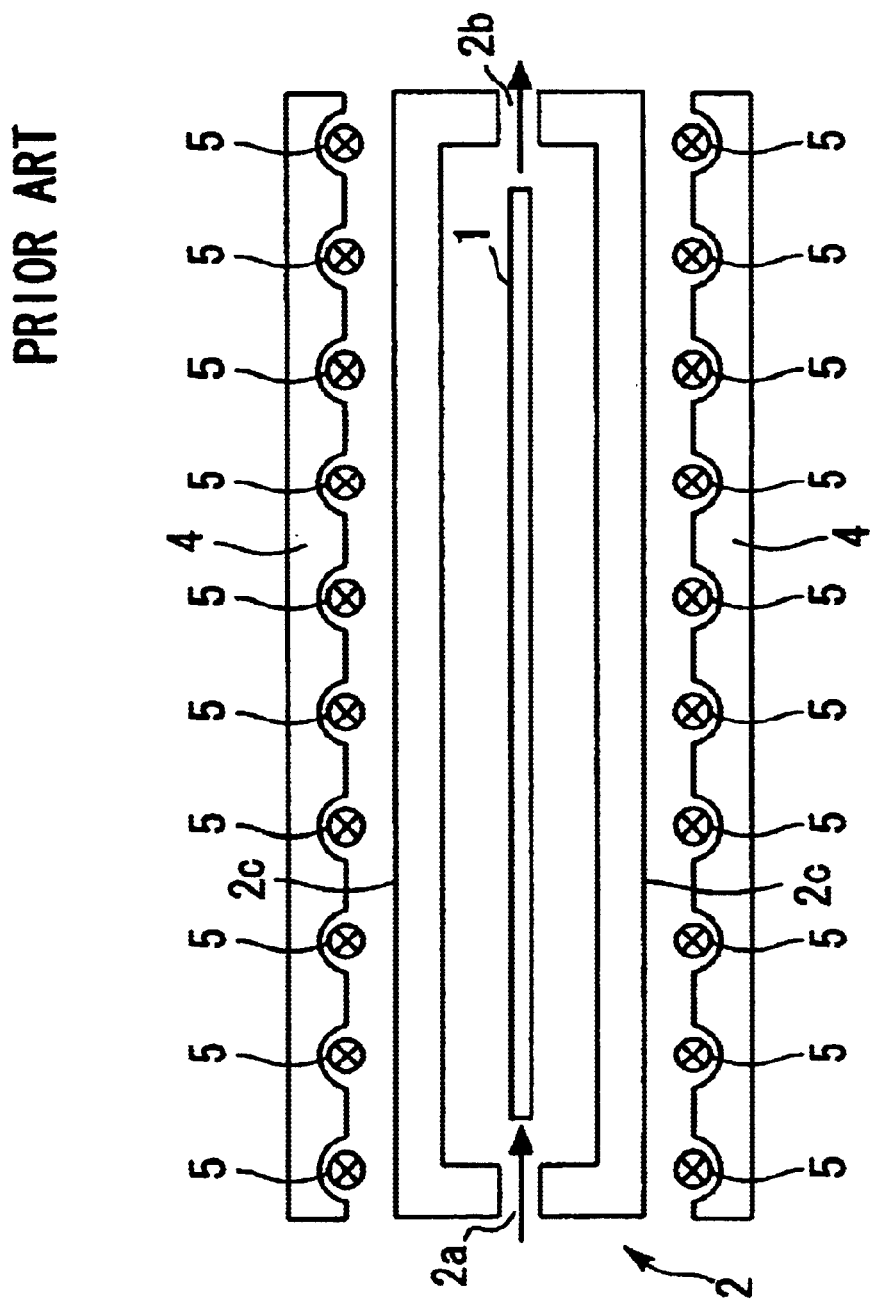
FIG. 3 is a sectional view of a conventional wafer heat-treatment system.

FIG. 2A is a diagram showing the variation of the pressure in the hollows 3 (FIG. 1) with time, in which P0 indicates an initial pressure in the hollows 3 before the evacuation of the hollows 3 by the vacuum pump 8, and P1 indicates a reduced pressure nearly equal to a perfect vacuum achieved by evacuation. In FIG. 2A, the interval between S0 and S1 corresponds to a time for the inert-gas replacement process carried out after placing the wafer 1 in the processing chamber 2, the interval between S1 and S3 corresponds to a time for the high-temperature heat-treatment process carried out after the inert-gas replacement process, and the interval between S3 and S4 corresponds to a time for the wafer cool down process between the end of the high-temperature heat-treatment process and the unloading of the wafer 1 from the processing chamber 2.

As obvious from FIG. 2A, the pressure in the hollows 3 is reduced gradually from the pressure P0 to the pressure P1 in a comparatively long time between S0 and S1. The hollows 3 are maintained at the pressure P1 between S1 and S3 during the high-temperature heat-treatment process. The pressure in the hollows 3 is increased from P1 to P0 in a short time immediately after S3.

FIG. 2B is a diagram showing the variation of the temperature of the wafer 1 (FIG. 1) with time, in which T0 indicates the initial temperature of the wafer 1 before the high-temperature heat-treatment process, T1 indicates the programmed temperature of the wafer 1 at soak step, T2 is the temperature of the wafer 1 after being cooled by the cool down process according to the present invention, and T3 is the temperature of the wafer 1 after being cooled by the conventional cool down process. In FIG. 2B, the interval between S1 and S2, which is the heat up process, corresponds to a time necessary for heating the wafer 1 from the temperature T0 to the temperature T1 in the high-temperature heat-treatment process. The interval between S2 and S3, which is the soak process, corresponds to a time necessary for keeping the wafer 1 at the temperature T1 during the high-temperature heat-treatment process. In FIG. 2B, a curve L1 (solid line) indicates the variation of the temperature of the wafer 1 with time when the wafer 1 is cooled by the cool down process according to the present invention, and a curve L2 (broken line) indicates the variation of the temperature of the wafer 1 with time when the wafer 1 is cooled by the conventional cool down process.

According to the present invention, the pressure in the hollows 3 is raised in a short time after the high-temperature heat-treatment process and hence the temperature in the processing chamber 2 can be decreased in a short time by the effect of the adiabatic expansion of the gas supplied into the hollows 3, which is apparent from the comparative examination of the curves L1 and L2. Thus, the cool down process according to the present invention can be achieved in a short time.

FIG. 2C is a diagram showing the variation of the power supplied to the heating lamps 5 with time, in which W0 indicates a magnitude of power supplied to the heating lamps 5 before the high-temperature heat-treatment process, W1 indicates a magnitude of power to be supplied to the heating lamps 5 to heat the wafer 1 rapidly in the high-temperature heat-treatment process, W2 indicates a magnitude of power necessary for maintaining the wafer 1 at a desired temperature during the high-temperature heat-treatment process according to the present invention, and W3 indicates a magnitude of power necessary for maintaining the wafer at a desired temperature during the conventional high-temperature heat-treatment process. In FIG. 2C, a solid line L3 indicates the variation of the magnitude of power supplied to the heating lamps 5 between the times S2 and S3 in the high-temperature heat-treatment process according to the present invention, and a broken line L4 indicates the variation of the magnitude of power supplied to the heating lamps 5 between the times S2 and S3 in the conventional high-temperature heat-treatment process.

According to the present invention, the processing chamber 2 is heat-insulated as mentioned above before the start of the high-temperature heat-treatment process by evacuating the hollows 3 nearly to a perfect vacuum. Therefore, as obvious from the comparative examination of the lines L3 and L4, the heating lamps 5 of the wafer heat-treatment system according to the present invention require less power than those of the conventional wafer heat-treatment system to maintain wafer 1 at the set high temperature. A shaded area in FIG. 2C represents the amount of electric power saved by the wafer heat-treatment system of the present invention. Thus, the wafer heat-treatment system according to the present invention is capable of achieving the soak process at substantially the same temperature as the conventional wafer heat-treatment system, consuming less power by the heating lamps.

As apparent from the foregoing description, the wafer heat-treatment system according to the present invention reduces power consumption by the heating lamps 5 by carrying out the evacuating process before the high-temperature heat-treatment process, and shortens the time necessary for the cool down process by the pressurizing process that is carried out after the completion of the high-temperature heat-treatment process.

In the wafer heat-treatment system, the pressure regulating unit may reduce the pressure in the hollow before processing the wafer by the high-temperature heat-treatment process.

In the wafer heat-treatment system, the pressure regulating unit may raise the pressure in the hollow in a short time after processing the wafer by the high-temperature heat-treatment process.

In the wafer heat-treatment system, the gas sealed in the hollow may be a helium gas or a nitrogen gas or oxygen gas.

In the wafer heat-treatment method, the step of regulating pressure in the hollows may comprise the step of reducing the pressure in the hollows before processing the wafer by the high-temperature heat-treatment process.

In the wafer heat-treatment method, the step of regulating pressure in the hollows may comprise the step of increasing the pressure in the hollows in a short time after processing the wafer by the high-temperature heat-treatment process.

In the wafer heat-treatment method, a helium gas or a nitrogen gas or oxygen gas may be sealed in the hollows.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-036040, filed on Feb. 13, 2001 including specification, claims, drawings and summary, on which the Convention priority of the present application is based, are incorporated herein by reference in its entirety.

What is claimed is:

1. A wafer heat-treatment system for processing a wafer by a high-temperature heat-treatment process and cooling the heat-treated wafer, said wafer heat-treatment system comprising:

walls surrounding a closed space enclosing the wafer and having a hollow sealing a gas in said walls; and a pressure-regulating unit connecting to said hollow for regulating pressure in said hollow.

2. The wafer heat-treatment system according to claim 1, wherein said pressure regulating unit reduces the pressure in said hollow before processing the wafer by the high-temperature heat-treatment process.

3. The wafer heat-treatment system according to claim 2, wherein said pressure regulating unit raises the pressure in said hollow in a short time after processing the wafer by the high-temperature heat-treatment process.

4. The wafer heat-treatment system according to claim 3, wherein the gas sealed in said hollow is a helium gas or a nitrogen gas or oxygen gas.

5. The wafer heat-treatment system according to claim 2, wherein the gas sealed in said hollow is a helium gas or a nitrogen gas or oxygen gas.

6. The wafer heat-treatment system according to claim 1, wherein said pressure regulating unit raises the pressure in said hollow in a short time after processing the wafer by the high-temperature heat-treatment process.

7. The wafer heat-treatment system according to claim 6, wherein the gas sealed in said hollow is a helium gas or a nitrogen gas or oxygen gas.

8. The wafer heat-treatment system according to claim 1, wherein the gas sealed in said hollow is a helium gas or a nitrogen gas or oxygen gas.

9. A wafer heat-treatment method comprising the steps of:

processing a wafer, which is in a closed space surrounded by walls each having a hollow, by a high-temperature heat-treatment process;

cooling the heat-treated wafer, which is in said closed space, after the high-temperature heat-treatment process; and regulating pressure in said hollows of said walls.

10. The wafer heat-treatment method according to claim 9, wherein the step of regulating pressure in said hollows comprises the step of reducing the pressure in said hollows before processing the wafer by the high-temperature heat-treatment process.

11. The wafer heat-treatment method according to claim 10, wherein the step of regulating pressure in said hollows comprises the step of increasing the pressure in said hollows in a short time after processing the wafer by the high-temperature heat-treatment process.

12. The wafer heat-treatment method according to claim 11, wherein a helium gas or a nitrogen gas or oxygen gas is sealed in said hollows.

13. The wafer heat-treatment method according to claim 10, wherein a helium gas or a nitrogen gas or oxygen gas is sealed in said hollows.

14. The wafer heat-treatment method according to claim 9, wherein the step of regulating pressure in said hollows comprises the step of increasing the pressure in said hollows in a short time after processing the wafer by the high-temperature heat-treatment process.

15. The wafer heat-treatment method according to claim 14, wherein a helium gas or a nitrogen gas or oxygen gas is sealed in said hollows.

16. The wafer heat-treatment method according to claim 9, wherein a helium gas or a nitrogen gas or oxygen gas is sealed in said hollows.

* * * * *